(12) United States Patent
Abele et al.

(10) Patent No.: US 9,507,143 B2
(45) Date of Patent: Nov. 29, 2016

(54) COMPACT ILLUMINATION SYSTEM

(71) Applicant: Intel Corporation, Santa Clara, CA (US)

(72) Inventors: Nicolas Abele, Demoret (CH); Lucio Kilcher, Montreux (CH)

(73) Assignee: INTEL CORPORATION, Santa Clara, CA (US)

( * ) Notice: Subject to any disclaimer, the term of this patent is extended or adjusted under 35 U.S.C. 154(b) by 139 days.

(21) Appl. No.: 14/491,012

(22) Filed: Sep. 19, 2014

(65) Prior Publication Data

US 2016/0085068 A1    Mar. 24, 2016

(51) Int. Cl.
*G02B 26/10* (2006.01)
*G02B 3/00* (2006.01)
*G02B 19/00* (2006.01)

(52) U.S. Cl.
CPC .......... *G02B 26/105* (2013.01); *G02B 19/0028* (2013.01); *G02B 19/0061* (2013.01)

(58) Field of Classification Search
CPC  G02B 26/05; G02B 3/0006; G02B 26/0841; G02B 26/085; G02B 26/0858; G02B 26/033; G02B 26/101; B81B 3/0083; B81B 3/0086; B81B 2203/04
USPC ......... 359/205.1, 198.1–199.4, 200.6–200.8, 359/202.1, 221.2, 223.1–225.1, 226.2, 904, 359/290–295, 838, 846, 871, 872; 29/428; 250/204, 559.06, 559.29, 230, 234; 347/255–260; 353/39, 98–99; 385/15–18, 22; 398/12, 19, 45
See application file for complete search history.

(56) References Cited

U.S. PATENT DOCUMENTS

| 5,103,381 | A | 4/1992 | Uke |
| 7,709,811 | B2 | 5/2010 | Conner |
| 2005/0168994 | A1 | 8/2005 | Jacobson et al. |
| 2008/0230934 | A1* | 9/2008 | Rudmann ............... H01L 25/50 264/2.7 |
| 2009/0244882 | A1 | 10/2009 | Samber et al. |
| 2010/0110517 | A1* | 5/2010 | Shikii .................. G02B 26/123 359/207.1 |
| 2013/0015338 | A1* | 1/2013 | Masa ....................... G01D 5/38 250/231.13 |
| 2013/0019461 | A1 | 1/2013 | Rudmann et al. |
| 2013/0278907 | A1 | 10/2013 | Abele et al. |
| 2014/0029282 | A1 | 1/2014 | Ravier et al. |

FOREIGN PATENT DOCUMENTS

| WO | 2008/116335 | A2 | 10/2008 |
| WO | 2013/026174 | A2 | 2/2013 |
| WO | 2013/029667 | A1 | 3/2013 |
| WO | 2014/014411 | A1 | 1/2014 |

OTHER PUBLICATIONS

International Search Report and Written opinion received for PCT Patent Application No. PCT/US2015/050896, mailed Feb. 23, 2016, 12 pages.

\* cited by examiner

*Primary Examiner* — Zachary Wilkes
*Assistant Examiner* — George G King

(57) ABSTRACT

An illumination system includes a light source arranged for emitting non-collimated light towards a reflective surface of a scanning mirror assembly such that the light source occludes a region of the light reflected from the reflective surface. The scanning mirror assembly includes the reflective surface, which is arranged to be rotationally displaced around at least one rotation axis. The illumination system also includes an optical element for changing the propagation direction of the said reflected light so as to illuminate at least a part of the said occluded region.

18 Claims, 6 Drawing Sheets

COMPACT ILLUMINATION SYSTEM

TECHNICAL FIELD

The invention relates to the field of illumination systems to be used for instance in photographic flash or 3D sensing applications. More specifically, the present invention relates to illumination systems comprising at least one scanning mirror assembly. The invention also relates to a corresponding method of fabricating the illumination system.

BACKGROUND OF THE INVENTION

Scanning mirror-based light projection systems are known in the field of illumination systems. US2014/0029282 discloses an example of such a system, in which the light source is a laser type light source. A scanning mirror rotatable around two orthogonal axes is actuated and receives a light signal from a primary light source to project an image on to a phosphorous element. The light radiated by the primary light source, or more specifically its luminous intensity, for example, can be modulated to project a desired image on to the phosphorous element. The phosphorous element is then arranged to perform a wavelength conversion of the light signal received from the primary light source. Consequently the phosphorous element, acting as a secondary light source, re-emits light, which when combined with the light from the primary light source produce useful white light in various directions. In this kind of system a very high overall energy efficiency can be obtained, as the wavelength conversion performed by the phosphorous element is more energy efficient than the electrical-to-optical conversion of the laser light source. According to US2014/0029282, instead of using one scanning mirror rotatable around two orthogonal axes, it possible to use two mirrors instead, each movable around one axis, where the two axes are mutually orthogonal.

FIG. 1 shows a simplified cross-sectional view of an illumination system comprising a light source 1, such as a laser light source 1, and a scanning mirror assembly 3, which comprises a movable plate 5 arranged to be rotated about axis 7 in this example. The movable plate comprises a mirror and is connected to a frame 9 by two support arms (not shown), aligned on both sides of the plate along the same axis 7. In FIG. 1, the light emitted by the light source 1 is denoted by A, while the light reflected by the mirror is denoted by B. In order to save space, and in order to obtain a reflected image free of deformations, the light source should preferably be placed directly above the mirror so that the light beam A forms an angle of incidence at the mirror surface which is close to 90 degrees with respect to the centre point of the mirror when at rest. However, in this position the light source would obstruct the reflected light, thereby creating an occluded or non-illuminated spot behind the light source. In order to avoid this occlusion problem, a free passage to the reflected light directly above the mirror centre point can be guaranteed by arranging the light source slightly offset from a position directly above the centre point of the mirror, as shown in FIG. 1. However, the light source still obstructs some of the reflected light in the position as shown in FIG. 1. Furthermore, the arrangement of FIG. 1 is also not optimal in terms of use of space.

FIG. 2 shows a similar arrangement as in FIG. 1, but in this case the light source is still further offset with respect to the centre position. Now the light source no longer obstructs the reflected signals, but the configuration has the disadvantage that it takes up even more space than the configuration of FIG. 1, and the resulting or reflected image becomes clearly deformed due to the large angle of incidence of the light A striking the surface of the mirror. It is also to be noted that the current manufacturing processes of the above type illumination systems are not optimal. For instance, the angled configuration of FIG. 1 or 2 requires a very high precision in the alignment of various components, such as the light source and the scanning mirror assembly. This naturally increases the complexity of the manufacturing process.

SUMMARY OF THE INVENTION

It is an object of the present invention to overcome the problems identified above related to the scanning mirror illumination solutions.

According to a first aspect of the invention, there is provided an illumination system comprising:
  a light source arranged for emitting non-collimated light towards a reflective surface of a scanning mirror assembly such that the light source occludes a region of the light reflected from the reflective surface;
  the scanning mirror assembly comprising the reflective surface, arranged to be rotationally displaced around at least one rotation axis; and
  a first optical element for changing the propagation direction of the said reflected light so as to illuminate at least a part of the said occluded region.

The proposed solution provides a more compact illumination system since the light source is located in front of the scanning mirror assembly and thus the length of the light path from the light source to the reflective surface and onwards to an output aperture of the system can be minimised. The shadow or occlusion effect caused by the obstruction of the reflected light by the light source are mitigated by means of the optical element, which is placed so that it directs the reflected light into the occlusion region. Thus, the present invention at least partially overcomes the known problem that if the light is reflected back towards the light source, the light source occludes the reflected light.

According to variant of the first aspect, the first optical element is located at least partly beyond the light source with respect to the reflective surface.

According to another variant of the first aspect, the first optical element is located entirely beyond the light source with respect to the reflective surface.

According to another variant of the first aspect, the first optical element comprises a lens, a wavelength conversion element or a diffractive grating.

According to another variant of the first aspect, the light source is located on a first axis extending from a mid-point of the reflective surface and substantially orthogonal to the reflective surface when at rest and not subjected to a rotational displacement.

According to another variant of the first aspect, the cross-sectional shape of the first optical element is planoconvex, biconvex, plano-concave, biconcave, cylindrical, spherical or aspherical.

According to another variant of the first aspect, the first optical element comprises an array of lenses.

According to another variant of the first aspect, the system further comprises a support element between the light source and the first optical element and arranged to support the light source and the first optical element in their relative locations with respect to the axis of rotation of the reflective surface.

According to another variant of the first aspect, the system further comprises a second optical element for shaping the light emitted by the light source before the light reaches the reflective surface.

According to another variant of the first aspect, the first optical element comprises a lens and the system further comprises a wavelength conversion element.

According to another variant of the first aspect, the wavelength conversion element is located between the first optical element and the scanning mirror assembly.

According to another variant of the first aspect, the wavelength conversion element is located beyond the light source with respect to the reflective surface.

According to another variant of the first aspect, the light source is separated from the reflective surface by a distance equal to half the focal length of the first optical element.

According to a second aspect of the invention, there is provided a method of manufacturing an illumination system, the method comprising:

providing a first substrate and a second substrate;
  providing a light source on the first substrate, the light source being arranged to emit non-collimated light;
  providing a scanning mirror assembly on the second substrate, the scanning mirror assembly comprising a reflective surface arranged to be rotationally displaced around at least one rotation axis and to reflect the light emitted by the light source;
  providing a first optical element on the first substrate for changing the propagation direction of the light reflected from the reflective surface;
  providing a spacer element for retaining the first and second substrates at a predetermined separation distance from one another; and
  stacking the first substrate and the second substrate.

The proposed manufacturing process provides the advantage that it is suitable for very high volume production at low cost. Another advantage of the manufacturing process is that the obtainable manufacturing process yield is high. This is for example due to very small number of optical components per illumination system. In its simplest form, only three optical components, namely the light source, the optical element and the reflective surface, are needed. Also, the intended orthogonal arrangement of the light source with the mirror reflective surface may be out of alignment, and the system would still perform well. Another advantage is that number of reflections in the light path is minimised, thereby also minimising light loss, because each reflection introduces some light loss and then generates some "parasitic light" which may impair the resulting illumination profile.

According to a variant of the second aspect, the method further comprises providing one or more light sensors on the second substrate.

According to another variant of the second aspect, the one or more light sensors are provided so that they are separated from the scanning mirror assembly by a substantially non-transparent separator.

According to another variant of the second aspect, at least two optical elements and light sources are provided on the first substrate, and at least two scanning mirror assemblies are provided on the second substrate, and wherein the method further comprises cutting the stacked substrate structure to form at least two illumination system modules.

According to another variant of the second aspect, the first optical elements are provided by providing a mouldable transparent substrate on the first substrate and patterning this mouldable transparent substrate with a mould to form the first optical elements.

According to another variant of the second aspect, the light source is provided on a first surface of the first substrate, and wherein the first optical element is provided on a second surface of the first substrate, opposite to the first side.

According to another variant of the second aspect, the light source is provided on the first substrate so that it is arranged for emitting non-collimated light towards the reflective surface, the light source is located such that it occludes a region of the light reflected from the reflective surface, and the first optical element is arranged for changing the propagation direction of the said reflected light so as to illuminate at least a part of the said occluded region.

BRIEF DESCRIPTION OF THE DRAWINGS

Other features and advantages of the invention will become apparent from the following description of a non-limiting exemplary embodiment, with reference to the appended drawings, in which.

DETAILED DESCRIPTION OF AN EMBODIMENT OF THE INVENTION

Figure 1:
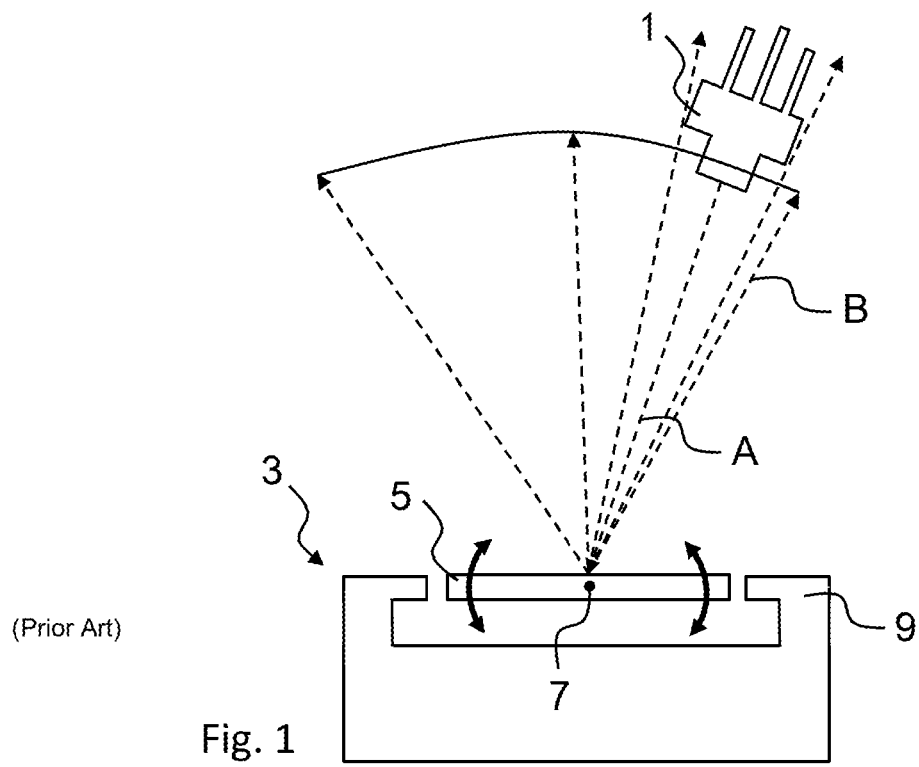
FIG. 1 is a simplified cross-sectional view of an illumination system according to prior art.
Figure 2:
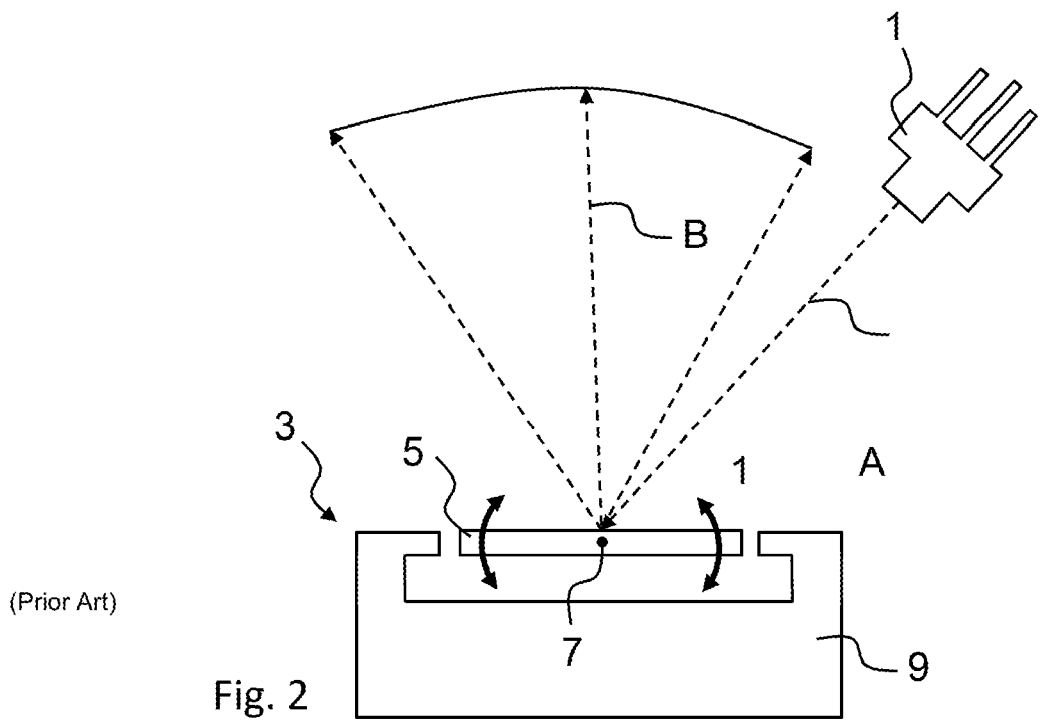
FIG. 2 is a simplified cross-sectional view of another illumination system according to prior art.

An embodiment of the present invention will now be described in detail with reference to the attached figures. Identical or corresponding functional and structural elements which appear in the different drawings are assigned the same reference numerals.

Figure 3:
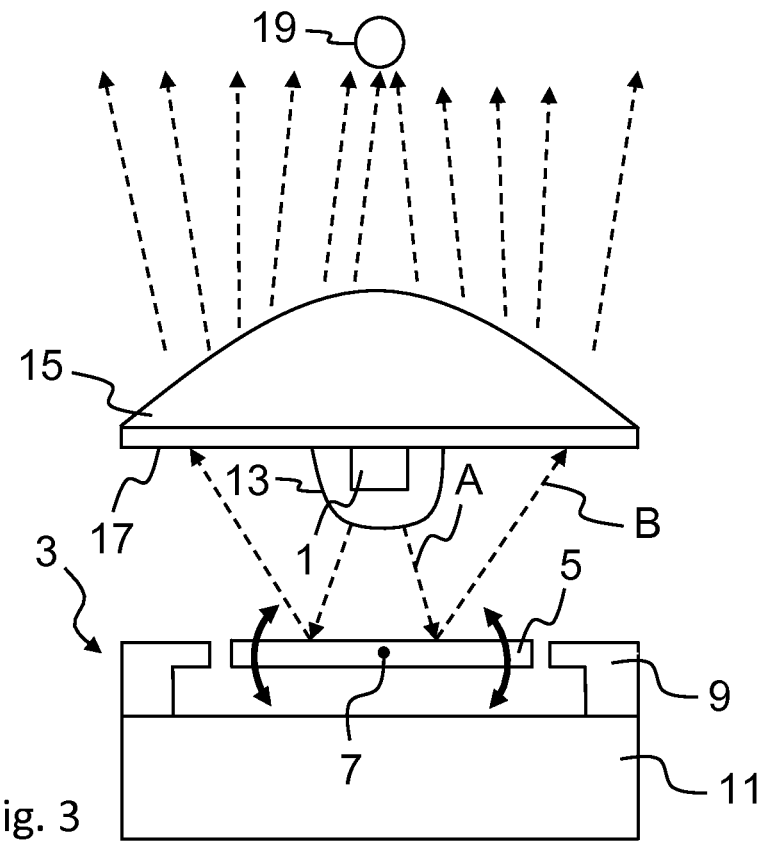
FIG. 3 is a simplified cross-sectional view of an illumination system according to an example of the present invention.
Figure 4:
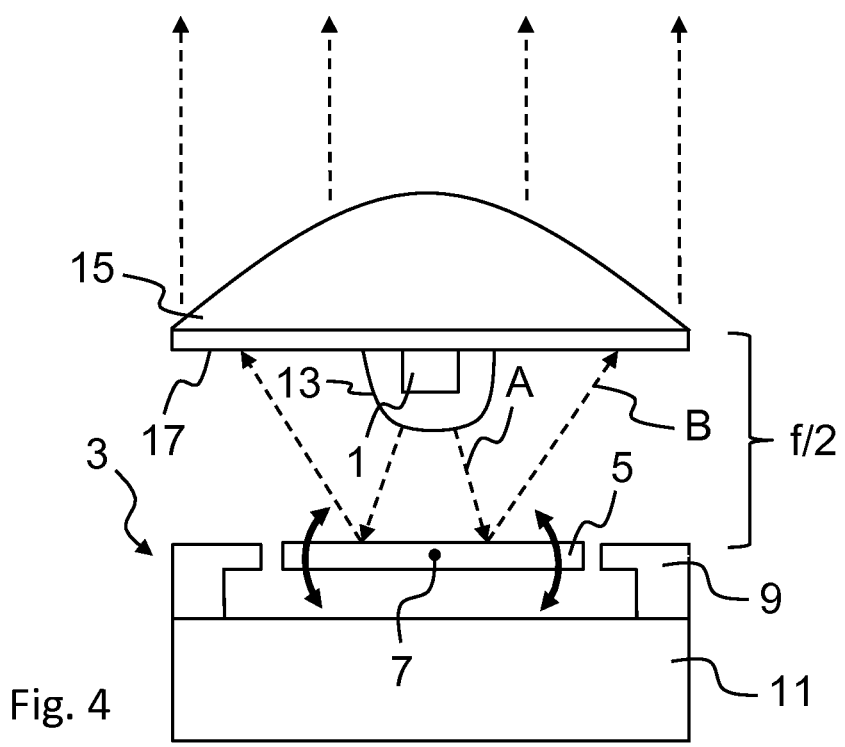
FIG. 4 is a simplified cross-sectional view of the illumination system of FIG. 3, but in which the distance between the light source and the reflective surface corresponds to half the focal length of the optical element used in the system.
Figure 5:
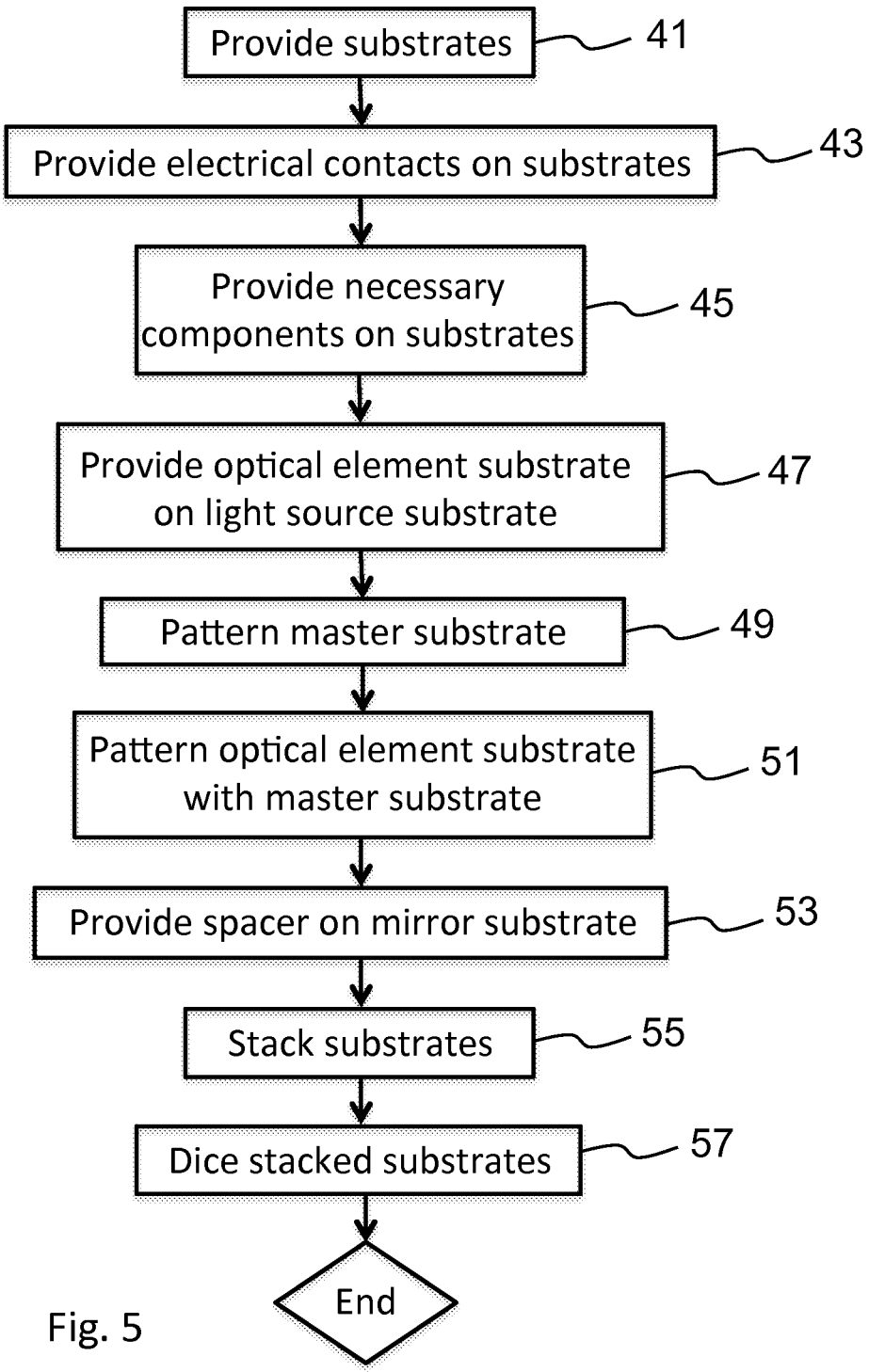
FIG. 5 is a flow diagram illustrating an exemplary manufacturing process of an illumination system of FIG. 3.

FIG. 3 is a schematic cross-sectional view illustrating an exemplary illumination or lighting system or device according to an embodiment of the present invention. This arrangement may be used for example in photographic flash applications or in 3D sensing solutions used for example in gesture sensing applications and/or three dimensional mapping of an object or the environment. FIG. 1 shows a light source 1. Various types of light sources and packaging may be used; light source 1 may be for example an edge emitting laser diode, a vertical-cavity surface-emitting laser (VCSEL), a light emitting diode (LED), a resonant-cavity LED, a micro-LED or an array of such light sources. The light source may be a monochromatic laser light source. If the illumination system is used for smart flash applications, then the light emitted is typically either an ultraviolet (UV) or near-UV light, with a wavelength of 360 nm to 480 nm once re-emitted by a wavelength conversion element as part of the system, or a visible light, obtained for example by use of three light sources (i.e. red, green and blue) that could generate a white beam or other colour beams once combined with each other. However, for other applications other wavelengths may be used, from UV light through visible light to infra-red light. The light source 1 typically emits non-collimated light, i.e. light whose rays are not parallel. As can be seen in FIG. 1, the light source is located in front of a scanning mirror system 3, and more specifically in front of a mirror which is formed on a movable plate 5. In this example the scanning mirror system is a MEMS (Micro-Electro-Mechanical System) scanning mirror. The movable plate 5 is arranged to be rotated about axis 7. The movable plate 5 is connected to a frame 9 by two support arms (not shown), aligned on both sides of the plate along the same axis 7. In this example, the mirror rotates about one axis, but it could also rotate about two mutually orthogonal axes. The advantage of a scanning system is that a real image can be projected, allowing the brightness of the projected image to be locally controlled (for example at the pixel level), so that the resulting projected and reflected light beam can have local brightness adjustments and/or a control of the contrast level between non-illuminated and illuminated pixels.

The scanning system 3 is arranged to deflect the light following various kinds of patterns, such as a Lissajous pattern or a raster pattern (interlaced or non-interlaced). Within the raster pattern projection, the image can also be displayed during the so-called fly-back scanning pattern (in a typical raster scan display, the MEMS mirror displays the image only in one sweep of the mirror or mirror axis controlling the image refresh rate (i.e. the mirror axis actuated outside of its resonant frequency once using a 2D MEMS mirror, which has the movable plate 5 that rotates about two mutually orthogonal axes), however in the fly-back option, the same or another pattern may be displayed on the other sweep of the mirror) or other patterns could be used, in which the direction of the scanning pattern can be switched (vertical scanning instead of horizontal scanning, for example, whereby the image is formed as vertical lines instead of from left to right, or vice-versa), or where the screen is scanned using any kind of space filling curve, for example Peano, Hilbert, or other fractal or L-system curves.

The scanning mirror system 3 may be actuated using magnetic, electrostatic, thermal, piezo-electric, hydraulic, pneumatic, chemical or acoustic means, for example. If the plate 5 is actuated magnetically, then the bottom and/or side parts of the scanning mirror system may comprise a magnet 11 for generating a magnetic field to move the plate comprising the mirror. In this example the light source is located in front of the mirror on an imaginary line drawn from the centre point of the mirror when at rest (rest position is the one shown in FIG. 3), or at a so-called neutral position, and having a 90 degree angle with respect to the mirror surface. Thus, the mirror has a light-source-facing side and a plate-facing side.

In this example, there is also shown an optical element 13, referred to in this text as the second optical element. The second optical element is optional and its purpose is to do some beam shaping, for example modifying the footprint profile of the beam and/or making the light diverging, or focusing, or collimating the light beam A emitted by the light source before it reaches the mirror. For instance, without the second optical element 13 it is possible that the light beam would have an elliptical footprint profile in the plane of the mirror surface. However, the second optical element 13 can be configured to change the footprint of the light beam, and make it for instance circular. The second optical element may simply be a lens, for example, whose form is selected depending on the kind of beam-forming desired.

Another optical element 15, referred to in this text as the first optical element, is provided on a support or substrate 17. In this example the first optical element 15 and the support are placed behind the light source 1 (when viewed from the plate 5). The first optical element may comprise a lens, a microlens array or a wavelength conversion element such as a phosphorous element, or a combination of the above elements. The first optical element may also or alternatively comprise a diffractive grating. The first optical element may be of glass or transparent plastic. The purpose of the first optical element 15 is to change the direction of propagation of the light B reflected from the mirror, and thereby to at least partly redirect the reflected light into an occluded region which is caused by the presence of the light source itself. As a result of this redirection of the reflected light by the first optical element 15, a sensor 19 (e.g. a person's eye) placed behind the first optical element at the position shown in FIG. 3 detects the image pattern of the reflected light as though the sensor had not been occluded by the light source, or at least the effect of obstruction is greatly reduced compared to a situation in which no first optical element 15 is present. In this manner, by placing the optics behind the light source, and by carefully designing the optics to compensate for the occlusion, the negative effects of the light obstruction caused by the light source 1 can be considerably reduced or even substantially removed.

This architecture also enables the manufacturing process, and the miniaturisation of such an optical system to be considerably simplified. Furthermore, because the light source is placed directly above or in front of the mirror, any resulting image projected by the mirror is less affected by deformations. If the first optical element comprises a lens, then the reflected light would retain at least some of it its optical characteristics as it passes through the lens. For instance, if the light beam reaching the first optical element is coherent, then also the redirected light beam would be coherent. The characteristics regarding the direction of the beam and the shape of the beam may be modified, on purpose, by the lens.

In the illustrated example, the first optical element comprises a plano-convex lens, arranged to converge the light beams passing through it, and in particular to provide greater convergence adjacent to the region where occlusion of the reflected light B occurs. However, other forms are also possible, depending on the implementation details. Examples of various optical element shapes which could also be used are biconvex, plano-concave (diverging the passing light beams), biconcave, meniscus, cylindrical, spherical or aspherical. The lens may also be a Fresnel lens which has the advantage of being thinner than a spherical, aspherical or cylindrical lens, thereby enabling even smaller illumination systems. The first optical element could also be an array of lenses or a phosphorous element having a flat or bumpy surface or a combination of a lens or microlens array with a phosphorous element placed either on top of the lens or microlens array or in between the element 17 and the lens or microlens array.

If the illumination system illustrated in FIG. 3 is used for distance measurement (3D mapping) applications, then the first optical element may comprise a lens or an array of lenses, and there may be no need for a wavelength conversion element. However, if the illumination system is used for smart flash applications, then system preferably comprises a wavelength conversion element. In this case, the optical element 15 could comprise the wavelength conversion element. Alternatively, the first optical element may comprise a lens, and a separate wavelength conversion element could be provided as a separate element. This wavelength conversion element may be placed for example between the support 17 and the first optical element 15, or the wavelength conversion element may be placed on the further side of the first optical element 15 (as viewed from the plate 5). The wavelength conversion element may be in direct contact with the first optical element, or it may be placed at a predetermined distance from the first optical element. The possibilities for optically modifying the light beam may be maximised by placing the wavelength conversion element at a distance from the first optical element. The wavelength conversion element may comprise a phosphor film, or a plate on which a preferably continuous and homogeneous layer of phosphor has been deposited. Each point on the wavelength conversion element receiving the light beam A from the scanning system, typically monochromatic, absorbs the light power and then re-emits a light B of one or more different wavelengths. The resulting combined light can be considered as "white", since it contains a plurality of wavelengths between about 400 nm and 800 nm. i.e. in the visible light spectrum.

If the scanning mirror reflective surface is placed at a distance equal to half the lens focal length (f/2) from the lens 15, or more precisely if the sum distance from the lens to the mirror plus the distance form the mirror to the light source emission point is equal to the focal length of the lens, then the resulting light beam may become collimated by the lens. This has the advantage that the projected light may substantially retain its shape and intensity profile over multiple projection distances. Alternatively, if the lens is placed closer or further away than f/2 from the reflective surface of the mirror, the resulting projected light will be diverging, thereby enabling the illumination system to cover a larger illumination area.

Figure 6A:
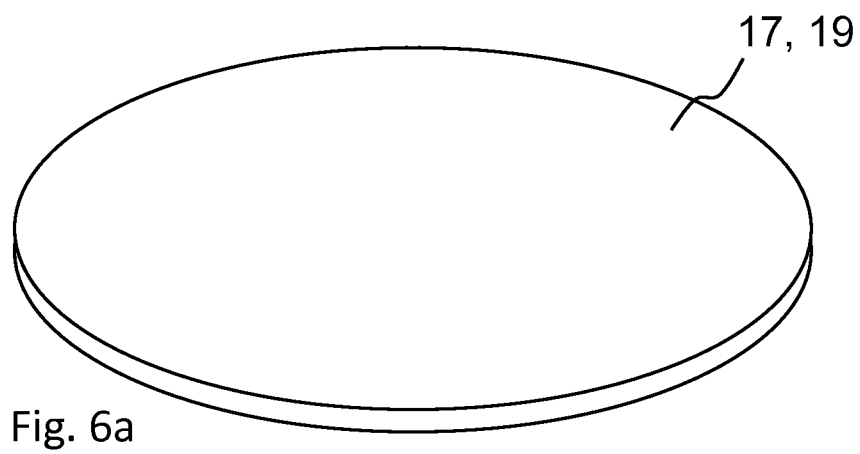
FIGS. 6a to 6k illustrate schematically various steps of the manufacturing process.
Figure 6B:
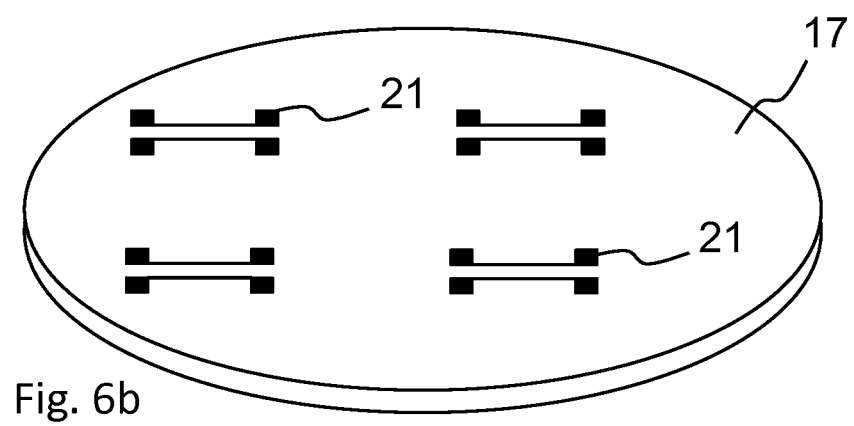
Figure 6C:
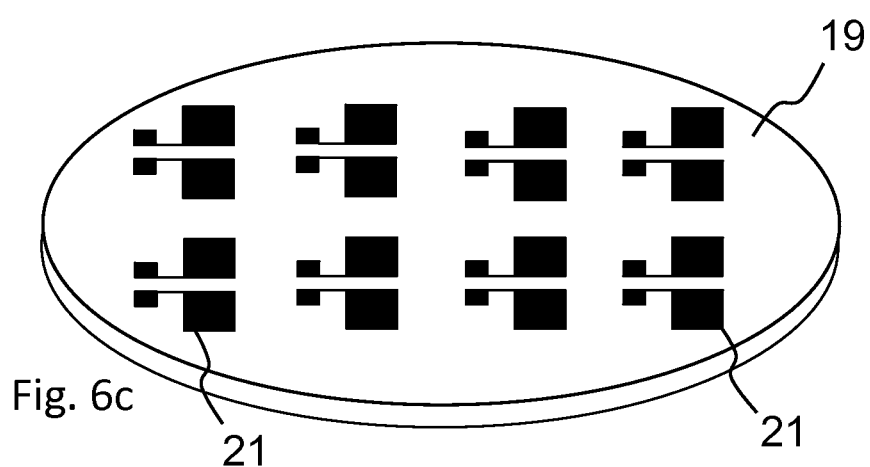

Next the manufacturing process of the above illumination system is explained with reference to the flow chart of FIG. 5 and FIGS. 6a to 6k. In step 41 a first substrate 17 (FIG. 6a), also referred to as a light source substrate, and a second substrate 19 (FIG. 6a), also referred to as a mirror substrate, are provided or manufactured. The light source substrate 17 is transparent and may be a wafer and typically made of glass, plastic or silicon (if an infra-red laser is used). The mirror substrate 19 may be a wafer made of silicon or glass or electronics printed circuit board (PCB) and for example made of FR4 material (woven fiberglass cloth with an epoxy binder). In step 43 electrical contact elements 21 are provided on the substrates as shown in FIGS. 6b and 6c. These contacts 21 may for example be conductive indium tin oxide (ITO) or tin-doped indium oxide layers. Such contacts are nearly transparent. When it comes to the light source substrate 17, this transparency property has the advantage that obstructions to the light passing through the substrate can be minimised. These contacts may be simply metallic contact elements. The contacts may be deposited on the surface of the substrates and then patterned. As can be seen, in the illustrated example, the contact elements may be provided as pairs, however other arrangements are possible, and the number of the contacts depends on the wirings required in the fabrication process. For simplicity, the illustrated example is shown with only four contact pairs in two rows on the light source substrate, while eight contact pairs in two rows are provided on the mirror substrate. However, it is to be noted that in practical implementations each substrate may contain tens, hundreds or thousands or more of contacts. Contact pads 23 may also be provided on the reverse side of the substrate. In step 43 holes or vias 25 may also be provided in the substrate to enable connections from one side of the substrate to the other. The holes, or vias, could be present in the substrates before the formation of the contact elements on the substrates.

Figure 6D:
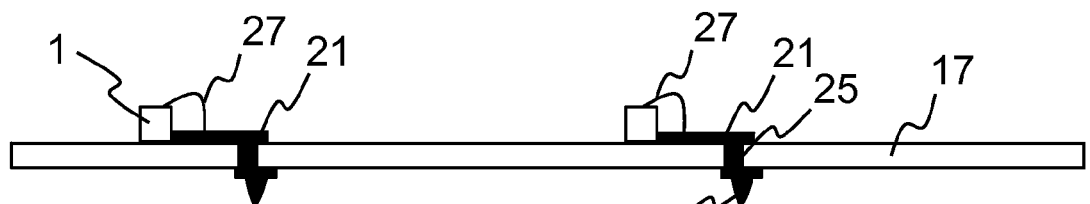
Figure 6E:
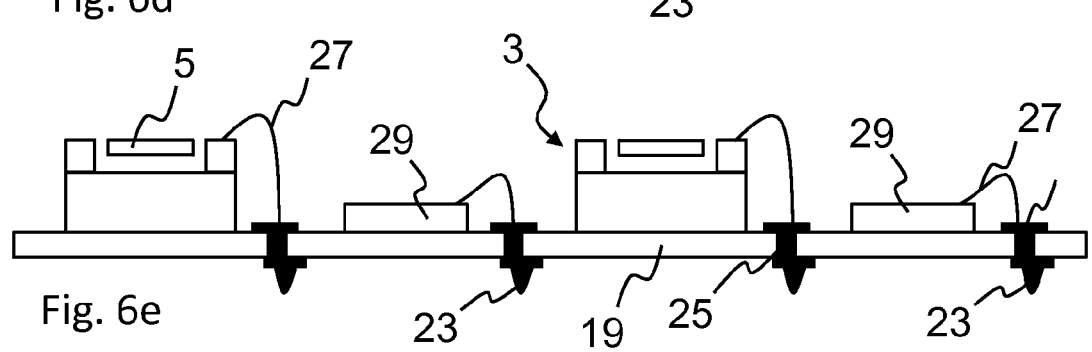
Figure 6F:
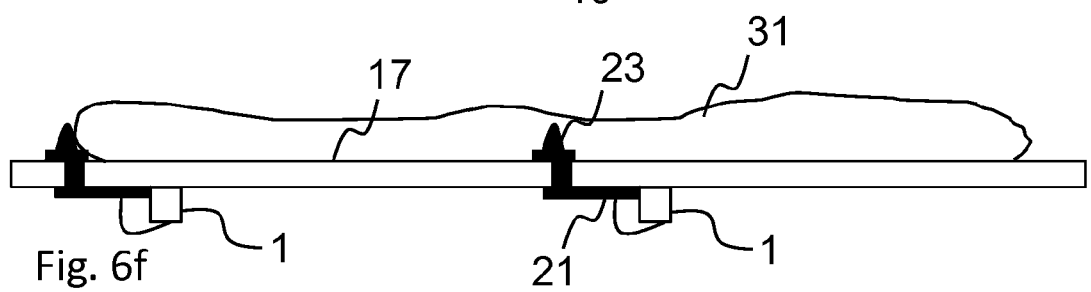
Figure 6G:
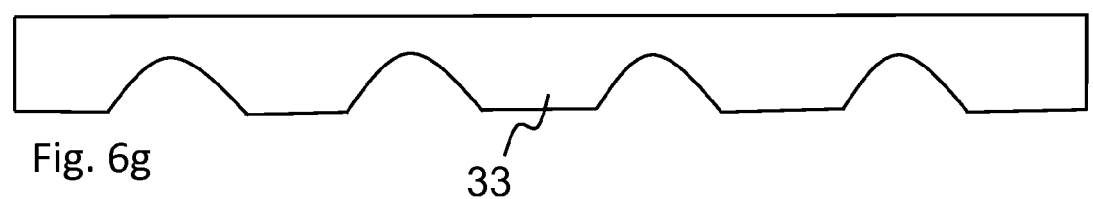
Figure 6H:
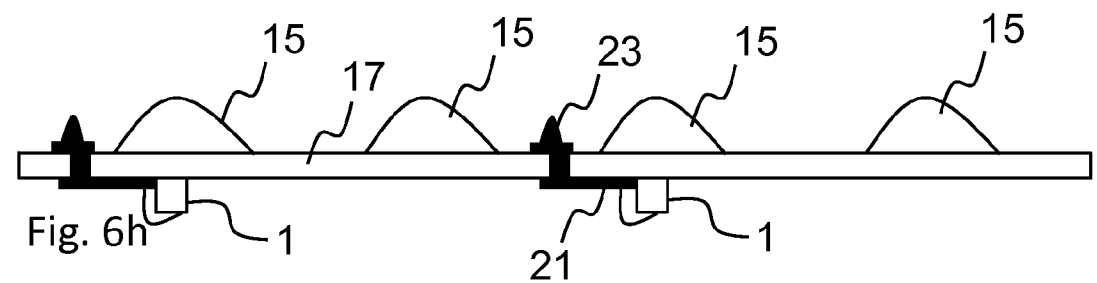

In step 45, various components, such as the light sources 1 and the scanning mirror systems 3, including the required connection wires 27, are provided or formed on the respective substrates as shown in FIGS. 6d and 6e. This can be accomplished by placing the components by pick-and-place by using standard pick-and-place machines, for example. In this example, light sensors 29 are also provided or formed on the mirror substrate 19 so that a light sensor is provided for every scanning mirror system, and these elements are provided in an alternating sequence on the mirror substrate 19. This step may also include adding the connection wires 27 and connecting the wires to the respective components by soldering for example. In step 47, an optical element substrate 31 is deposited on the light source substrate 17 on the same side as the contact pads 23, as shown in FIG. 6f. In step 49 a master substrate 33, a mask or a mould, is patterned with a pattern which is inverted or opposite to the desired form of the first optical elements, as illustrated in FIG. 6g. The master substrate may be of a glass, polymer, silicon, metal such as copper or nickel material, for example. In step 51 the optical element substrate is patterned by using the master substrate 33 to generate the desired first optical elements 15 on the light source substrate surface as shown in FIG. 6h. The patterning operations may be done for example by hot embossing, stamping and/or by applying pressure jointly with or separately to the final curing, or hardening, of the optical element curing done by thermal or UV curing in the case of the optical element made of respectively thermally curable material, or UV curable material such as UV curable polymer, or a mix of both.

Figure 6I:
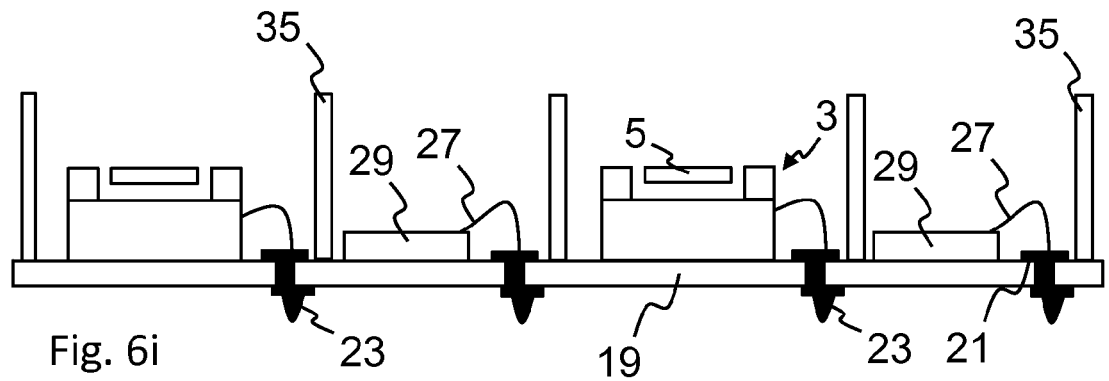
Figure 6J:
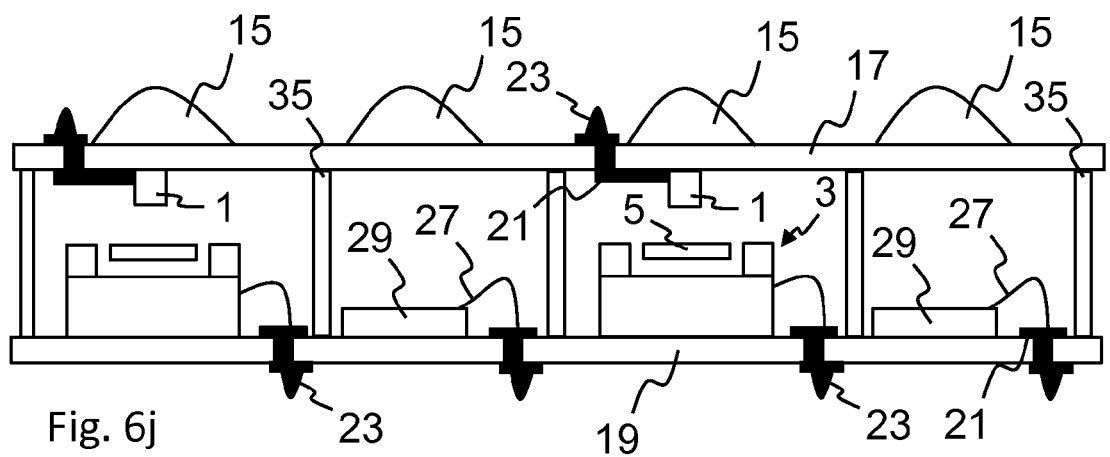
Figure 6K:
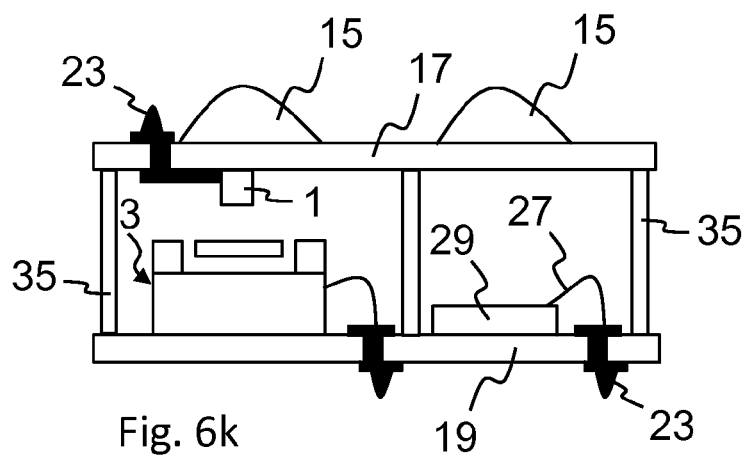

In step 53 a spacer element 35 is provided on the mirror substrate 19, as shown in FIG. 6i. This may be accomplished by deposition and patterning of polymer material, for instance, or by using a complete spacer wafer having through holes. The spacer 35 preferably has non-transparent surfaces to avoid any parasitic light beam emitted by the light source 1 and reflected by the scanning system 3 to illuminate the light sensor 29. For example the spacer may be made of silicon or non-transparent, or opaque, plastic or polymer material or non-transparent, or opaque, glass. In step 55 the light source substrate 17 is stacked on the mirror substrate 19 so that the light source substrate is supported by the spacers, as shown in FIG. 6j. In step 57 the stacked substrates are diced or cut to form finalised complete system modules. In this example, each final module comprises one illumination system module next to a sensor module. In another arrangement, the module could be composed of one illumination system module and multiple sensor modules. This may done, for example, in order to create redundancy in the sensed light as two or more sensors would be able to sense the light reflected by the illuminated object and then an algorithm may be able to compare the obtained information and then enable stronger system redundancy and therefore robustness. The same module may be used in a way compatible with stereovision and/or triangulation, where the distance information is derived by computing the light information detected by two sensors, placed at different locations. This kind of complete module may be used for distance measurements and is thus suitable for 3D sensing, for instance. If such modules are used for photographic flash applications, then the sensor module may be arranged to measure ambient light, for instance. Alternatively, depending on the specific application, the sensor module may not be needed at all. By including many (typically hundreds or more) light sources, scanning mirror assemblies and optical elements together with other required components provided on the two substrates, more of the manufacturing process can be carried out during substrate-level assembly, instead of relying on individual parts assembly steps.

The above described exemplary manufacturing process may be adapted in various ways. For example, the order of the above steps may be changed. For instance, the spacer may be provided on the mirror substrate before providing the necessary components on that substrate, or at the same time as the other components. It would be also possible to provide the spacer on the light source substrate instead of providing it on the mirror substrate.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used.

The invention claimed is:

1. An illumination system comprising:
   a scanning mirror assembly comprising a reflective surface, the scanning mirror assembly to be rotationally displaced around at least one rotation axis;
   a light source to emit non-collimated light towards the reflective surface, the light source disposed on a first axis, the first axis to extend substantially orthogonal from a mid-point of the reflective surface when the reflective surface is not subjected to a rotational displacement, the light source to occlude a region of the light reflected from the reflective surface; and
   a first optical element to change a propagation direction of the reflected light to illuminate at least a portion of the occluded region.

2. A system according to claim 1, wherein the first optical element is located at least partly beyond the light source with respect to the reflective surface.

3. A system according to claim 1, wherein the first optical element is located entirely beyond the light source with respect to the reflective surface.

4. A system according to claim 1, wherein the first optical element comprises a lens, a wavelength conversion element or a diffractive grating.

5. A system according to claim 1, wherein the cross-sectional shape of the first optical element is plano-convex, biconvex, plano-concave, biconcave, cylindrical, spherical or aspherical.

6. A system according to claim 1, wherein the first optical element comprises an array of lenses.

7. A system according to claim 1, further comprising a support element between the light source and the first optical element and arranged to support the light source and the first optical element in their relative locations with respect to the rotation axis.

8. A system according to claim 1, further comprising a second optical element for shaping the light emitted by the light source before the light reaches the reflective surface.

9. A system according to claim 1, wherein the first optical element comprises a lens and the system further comprises a wavelength conversion element.

10. A system according to claim 9, wherein the wavelength conversion element is located between the first optical element and the scanning mirror assembly.

11. A system according to claim 9, wherein the wavelength conversion element is located beyond the light source with respect to the reflective surface.

12. A system according to claim 1, wherein the light source is separated from the reflective surface by a distance equal to half a focal length of the first optical element.

13. A method of manufacturing an illumination system, the method comprising:
    providing a first substrate and a second substrate;
    providing a light source on the first substrate, the light source being arranged to emit non-collimated light;
    providing one or more light sensors on the second substrate;
    providing a scanning mirror assembly on the second substrate, the scanning mirror assembly comprising a reflective surface arranged to be rotationally displaced around at least one rotation axis and to reflect the light emitted by the light source;
    providing a first optical element on the first substrate for changing a propagation direction of the light reflected from the reflective surface;
    providing a spacer element for retaining the first and second substrates at a predetermined separation distance from one another; and
    stacking the first substrate and the second substrate.

14. A method according to claim 13, wherein the one or more light sensors are provided so that they are separated from the scanning mirror assembly by a substantially non-transparent separator.

15. A method according to claim 13, wherein at least two optical elements and light sources are provided on the first substrate, and at least two scanning mirror assemblies are provided on the second substrate, and wherein the method further comprises cutting the stacked first and second substrate to form at least two illumination system modules.

16. A method according to claim 13, wherein the first optical elements are provided by providing a mouldable transparent substrate on the first substrate and patterning this mouldable transparent substrate with a mold to form the first optical elements.

17. A method according to claim 13, wherein the light source is provided on a first surface of the first substrate, and wherein the first optical element is provided on a second surface of the first substrate, opposite to the first surface.

18. A method according to claim 13, wherein the light source is provided on the first substrate so that it is arranged for emitting non-collimated light towards the reflective surface, the light source is located such that it occludes a region of the light reflected from the reflective surface, and the first optical element is arranged for changing the propagation direction of the said reflected light so as to illuminate at least a part of the said occluded region.

* * * * *